(12) United States Patent
Reining

(10) Patent No.: US 8,983,105 B2
(45) Date of Patent: Mar. 17, 2015

(54) MICROPHONE

(75) Inventor: Friedrich Reining, Vienna (AT)

(73) Assignee: Knowles IPC (M) Sdn. Bhd., Pulau Pinang (MY)

( * ) Notice: Subject to any disclaimer, the term of this patent is extended or adjusted under 35 U.S.C. 154(b) by 0 days.

(21) Appl. No.: 13/642,499

(22) PCT Filed: Apr. 5, 2011

(86) PCT No.: PCT/IB2011/051460
§ 371 (c)(1),
(2), (4) Date: Oct. 19, 2012

(87) PCT Pub. No.: WO2011/132099
PCT Pub. Date: Oct. 27, 2011

(65) Prior Publication Data
US 2013/0051598 A1 Feb. 28, 2013

(30) Foreign Application Priority Data

Apr. 21, 2010 (EP) .................................. 10160640
Oct. 8, 2010 (EP) .................................. 10187007

(51) Int. Cl.
*H04R 1/04* (2006.01)
*B81B 7/00* (2006.01)
(Continued)

(52) U.S. Cl.
CPC ............. *H04R 1/04* (2013.01); *B81B 7/0061* (2013.01); *H04R 1/342* (2013.01); *B81B 2201/0257* (2013.01); *H04R 19/005* (2013.01); *H04R 31/00* (2013.01)
USPC ........... 381/355; 381/369; 381/360; 381/357; 381/150

(58) Field of Classification Search
USPC ......... 381/150, 355, 357, 360, 369, 174, 175; 156/145
See application file for complete search history.

(56) References Cited

U.S. PATENT DOCUMENTS 7,843,021 B2 * 11/2010 Zhe et al. ...................... 257/416
8,114,697 B2 * 2/2012 Kim et al. ....................... 438/51
(Continued)

FOREIGN PATENT DOCUMENTS

CN 1886008 A 12/2006
EP 1821570 A1 8/2007
(Continued)

OTHER PUBLICATIONS

International Search Report and Written Opinion for International Patent Application PCT/IB2011/051460 (Jul. 28, 2011).
(Continued)

*Primary Examiner* — Ahmad F Matar
*Assistant Examiner* — Sabrina Diaz
(74) *Attorney, Agent, or Firm* — Steven McMahon Zeller; Dykema Gossett PLLC

(57) ABSTRACT

A microphone is disclosed in which a housing is formed by a cap (13) sealed to a substrate (11). A MEMS die (10) is mounted on the substrate (11), the MEMS die (10) incorporating a membrane (12). The membrane (12) has a first surface facing the substrate and in fluid communication with an acoustic inlet port (14) in the cap (13) via an acoustic path (17) and a second surface facing the inner surface of the cap, which second surface along with part of the inner surface of the cap (13) defines at least part of a sealed chamber (19) within which a volume of air is trapped.

15 Claims, 8 Drawing Sheets

(51) Int. Cl.
*H04R 1/34* (2006.01)
*H04R 19/00* (2006.01)
*H04R 31/00* (2006.01)

(56) References Cited

U.S. PATENT DOCUMENTS

| | | | |
|---|---|---|---|
| 8,284,966 B2 * | 10/2012 | Wilk et al. | 381/189 |
| 8,284,979 B2 * | 10/2012 | Song | 381/369 |
| 8,442,254 B2 * | 5/2013 | Yu et al. | 381/334 |
| 8,530,981 B2 * | 9/2013 | Huckabee et al. | 257/414 |
| 2007/0116261 A1 * | 5/2007 | Hawker et al. | 379/419 |
| 2009/0020501 A1 | 1/2009 | Tien | |
| 2010/0272302 A1 * | 10/2010 | Feiertag et al. | 381/361 |

FOREIGN PATENT DOCUMENTS

| | | |
|---|---|---|
| EP | 1992588 A2 | 11/2008 |
| FR | 2907633 A1 | 4/2008 |
| WO | 2009/038692 A1 | 3/2009 |

OTHER PUBLICATIONS

Extended European Search Report for Pat. Appl. No. EP10187007.9 (Jul. 26, 2011).

Extended European Search Report for Pat. Appl. No. EP10160640.8 (Jul. 21, 2010).

\* cited by examiner

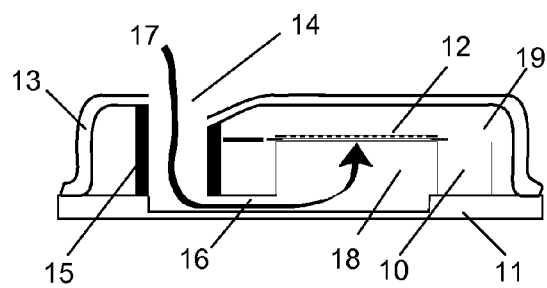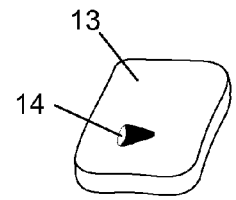
Figure 7a  Figure 7b
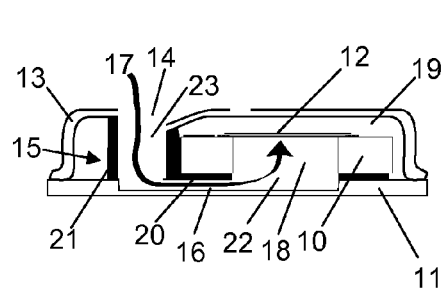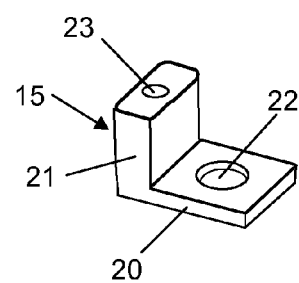
Figure 8a  Figure 8b

MICROPHONE

CROSS REFERENCE TO RELATED APPLICATIONS

This application is a National Phase of PCT International Application No. PCT/IB2011/051460, filed Apr. 5, 2011, which claims priority to European Patent Application Nos. 10160640.8, filed Apr. 21, 2010, and 1018707.9, filed Oct. 8, 2010, the entire disclosures of which are herein expressly incorporated by reference.

BACKGROUND OF THE INVENTION

This invention relates to a microphone comprising a housing formed by a cap sealed to a substrate and a MEMS (microelectromechanical systems) die mounted on the substrate. It also relates to a method of manufacturing such a microphone.

This type of microphone, known as a MEMS microphone, can be divided into top-port microphones (with the acoustic inlet port on the top side of the housing and the contacts on the bottom side) and bottom-port microphones (with the acoustic inlet port and contacts on the bottom side).

A cross-section through a bottom-port microphone is shown in FIG. 1. A MEMS die 1 is mounted on a laminate base 2 along with an application specific integrated circuit (ASIC) 3. An acoustic inlet port 4 allows sound pressure waves to move a membrane 5, which forms part of the MEMS die 1. In response to the motion of the membrane 5, its capacitance varies, and this variation in capacitance is detected and processed by ASIC 3. An output signal from ASIC 3 is made available at contacts on the laminate base 2. The volume trapped between the membrane 5 and the cap 6 is relatively large and does not affect the compliance of the membrane 5 significantly. The microphone is therefore quite sensitive and exhibits a high signal-to-noise ratio (SNR). In this design of microphone, the contacts and acoustic inlet port are both provided on the laminate base 2. This can be quite restrictive in some applications, for example if it is desired to have the acoustic inlet port on the opposite side from the contacts.

FIG. 2 shows a cross-section through a top-port design of microphone, in which the acoustic inlet port 4 is provided in the cap 6 rather than in the laminate base 2, thereby overcoming this restriction. This type of device suffers, however, from some significant problems. Specifically, it has a lower sensitivity and SNR due to the small volume behind the membrane (i.e. the volume trapped between the membrane 5, MEMS die side walls and the laminate base 2). This small volume significantly affects the compliance of the membrane 5.

Furthermore, the reliability of the device is poor relative to the bottom-port design. This is because the acoustic inlet port 4 (which has a rather large diameter in the region of 500 μm) exposes the microphone components to the environment. The components are very sensitive to moisture, especially the MEMS die 1, which has circuit impedances in the TΩ range. The reliability can be improved somewhat by application of a hydrophobic varnish to seal ultra-high impedance areas from moisture, but this would have to be done after assembly and wirebonding. As an example, the SPU0410HR5H PB top-port microphone has been found to comply with the Moisture Sensitivity Level Assessment MSLA2a reliability standard, whereas the equivalent bottom-port microphone complies with MSLA1, indicating an improved resilience to moisture. Furthermore, ingress of moisture is not the only concern; dust or other particles entering the acoustic inlet port 4 can also significantly degrade the microphone performance.

Another top-port design is shown in FIG. 3. This is identical to the design of FIG. 2, apart from a channel 7 formed in the laminate base 2. The channel 7 forms an extension to the chamber behind the membrane 5, thereby increasing the volume behind it. This has the effect of enhancing the sensitivity and SNR. However, it has no effect on the poor reliability and it is expensive to manufacture the channel 7.

BRIEF SUMMARY OF THE INVENTION

According to a first aspect of the invention, there is provided a microphone comprising a housing formed by a cap sealed to a substrate, and a MEMS die mounted on the substrate, the MEMS die incorporating a membrane, the membrane having a first surface facing the substrate and in fluid communication with an acoustic inlet port in the cap via an acoustic path and a second surface facing the inner surface of the cap, which second surface along with part of the inner surface of the cap defines at least part of a sealed chamber within which a volume of air is trapped, wherein the acoustic path is defined at least in part by an upright nozzle terminating at the acoustic inlet port at a first end and at a channel at the second end, the channel leading to a second chamber beneath the first surface of the membrane, wherein the upright nozzle comprises an insert which is provided within the sealed chamber, the nozzle being surrounded by the sealed chamber volume.

By providing a channel to couple the acoustic inlet port in the cap to the chamber formed between the membrane and the substrate, the invention allows a large volume to be provided behind the membrane. The sensitivity is therefore defined by the stiffness of the membrane alone since the effect of the volume of air trapped behind the membrane can be neglected. Furthermore, the sensitive electrical parts of the device are isolated from the environment by the membrane itself. Thus, the invention provides a top-port microphone design that has the high reliability, sensitivity and SNR of conventional bottom-port designs. In addition, the microphone can be manufactured using standard assembly processes, thereby keeping the costs associated with manufacture down.

The acoustic path is preferably sealed so that the path isolates the internal parts of the microphone from the environment.

The membrane effectively senses flexural motion, typically caused by a difference in pressure on the first and second surfaces, for example caused by an acoustic pressure wave coupled to the first surface from the acoustic inlet port.

In a preferred embodiment, the channel is formed in the substrate and/or a side wall of the MEMS die and coupling the second end of the nozzle to a second chamber, at least part of which is defined by the first surface of the membrane, thereby completing the acoustic path.

The channel may be provided in the substrate only, the side wall of the MEMS die only or in both the substrate and the side wall of the MEMS die.

The substrate is typically a laminate structure. It may be made from a ceramic material.

The cap may be made of metal, plastic or ceramic.

In one embodiment, the acoustic inlet port is formed by a single hole or by an array of holes.

Advantageously, the acoustic inlet port may be formed by making a slit in the cap and depressing the cap in a region adjacent the slit. The depression extends the full width of the slit, tapering to a point distal from the slit.

Preferably, the nozzle is sealed to the cap around the acoustic inlet port.

The nozzle may be sealed to the substrate and the side wall of the MEMS die.

In a preferred embodiment, the nozzle comprises a base portion and an upright portion disposed orthogonally to the base portion, the base portion having a first hole for coupling the second chamber to the channel and the upright portion having a second hole for coupling the acoustic inlet port to the channel.

In accordance with a second aspect of the invention, there is provided a method of manufacturing a microphone, the method comprising mounting a MEMS die on a substrate, providing an insert over the substrate, the insert comprising an upright nozzle and sealing the substrate to a cap, with an opening in the cap aligned with the nozzle, wherein the MEMS die incorporates a membrane and is mounted on the substrate such that first and second surfaces of the membrane face the substrate and an inner surface of the cap respectively, wherein sealing the substrate to the cap comprises:

forming a sealed chamber within which a volume of air is trapped, the sealed chamber being defined by the second surface of the membrane along with part of the inner surface of the cap, with the nozzle surrounded by the sealed chamber volume;

forming an acoustic path by which the first surface of the membrane is placed in fluid communication with an acoustic inlet port in the cap by means of the upright nozzle.

In a preferred embodiment, the method further comprises forming a channel in the substrate and/or a side wall of the MEMS die (10), the channel coupling a second chamber, at least part of which is defined by the first surface of the membrane, with the remainder of the acoustic path.

Typically, the method further comprises mounting a nozzle such that a first end of the nozzle terminates at the acoustic inlet port and the second end terminates at the channel, the nozzle thereby defining the remainder of the acoustic path.

Preferably, the method further comprises sealing the nozzle to the cap around the acoustic inlet port.

The method may further comprise sealing the nozzle to the substrate and the side wall of the MEMS die.

The nozzle may be sealed to the cap around the acoustic inlet port and/or to the substrate and side wall of the MEMS die using a silicone glue.

Typically, the MEMS die is mounted on the substrate using a silicone glue.

In one embodiment, the MEMS die is manufactured using a first anisotropic etching process, such as DRIE, to etch a region of the MEMS die defining a combination of a second chamber, at least part of which is defined by the first surface of the membrane, and the channel followed by a second anisotropic etching process, such as DRIE, to etch a region of the MEMS die defining the second chamber alone until the membrane is released.

Thus, the first anisotropic etching process forms the channel and starts to form the membrane. The second anisotropic etching process then completes the formation of the membrane.

BRIEF DESCRIPTION OF THE DRAWINGS

Examples of the invention will now be described in detail with reference to the accompanying drawings, in which:

FIGS. 7a and 7b show a second variant of the second embodiment according to the invention;

FIGS. 8a and 8b show a third variant of the second embodiment according to the invention;

DETAILED DESCRIPTION OF THE INVENTION

The invention provides a microphone comprising a housing formed by a cover sealed to a base, and a MEMS die mounted on the base. The MEMS die has a flexible membrane adapted to respond to motion by generating an electrical output signal. A first surface of the membrane is at one end of an acoustic path defined by an open chamber, at least part of which is defined by the first surface of the membrane, a channel formed in the base and/or a side wall of the MEMS die and a nozzle coupling the channel to an acoustic inlet port in the cap. A second surface of the membrane along with an inner surface of the cap defines at least part of a sealed chamber within which a volume of air is trapped.

Figure 4:
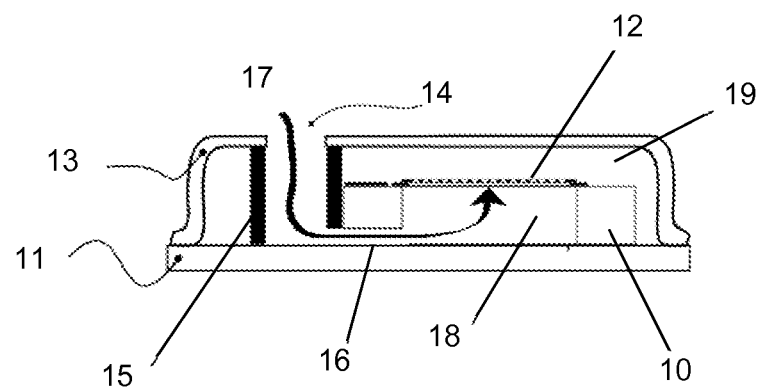
FIG. 4 shows a first embodiment of a microphone according to the invention.

FIG. 4 shows a first embodiment of a top-port microphone according to the invention. In this embodiment, a MEMS die 10 is mounted on a laminate base 11 using silicone glue. The MEMS die 10 has a membrane 12. Flexural motion of the membrane 12 causes an electrical signal to be generated by the MEMS die, which is processed by an ASIC (not shown). The processed signal is then supplied to external contacts (not shown) on the laminate base 11.

A cap 13 is placed over the whole assembly. The cap 13 is provided with an acoustic inlet port 14, which may be a single hole or an array of holes. The acoustic inlet port 14 may have a variety of shapes, but in this embodiment it is a round hole. A nozzle 15 is mounted such that one end is sealed to the cap 13 around the acoustic inlet port 14. The other end terminates at a channel 16 formed in a side wall of the MEMS die 10. Thus, an acoustic path 17 (shown by the arrow) is defined running from the acoustic inlet port 14 along the nozzle 15, through the channel 16 into a chamber 18 defined by a first surface of the membrane 12, the side walls of the MEMS die 10, and the laminate base 11. The nozzle is mounted using silicone glue such that the first end is sealed on the cap 13 around the acoustic inlet port 14 and the second end is sealed against the laminate base 11 and the side wall of the MEMS die 10.

The first surface of the membrane is therefore in fluid communication with the acoustic inlet port 14. Acoustic pressure waves in the air travel along the acoustic path 17 from the acoustic inlet port to the chamber 18, where they cause flexural motion of the membrane 12. The sensitivity of the membrane 12 to the acoustic pressure waves is defined largely by the stiffness of the membrane 12 itself since the volume of the chamber 19 defined by a second surface of the membrane 12 and an inner surface of the cap 13 is relatively large. The volume of chamber 19 therefore has little effect on the motion of the membrane 12 and can be neglected for practical purposes.

As can be seen, the nozzle 15 and membrane 12 isolate the sensitive parts of the device from the environment. The device therefore has similar reliability characteristics to a conventional bottom-port microphone.

Figure 5:
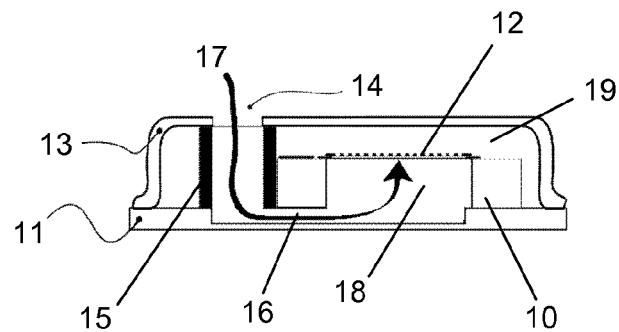
FIG. 5 shows a second embodiment of a microphone according to the invention.
Figure 6:
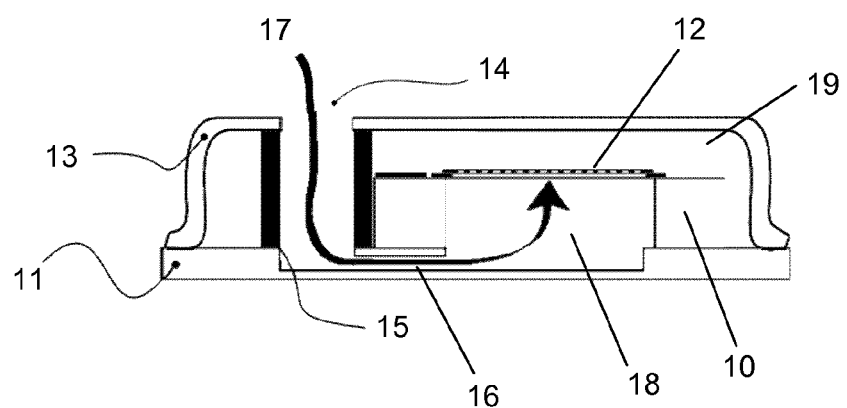
FIG. 6 shows a first variant of the second embodiment according to the invention.

FIG. 5 shows a second embodiment of the invention. This is very similar to the first embodiment, the only difference being that the channel 16 is formed in the laminate base 11 rather than in the MEMS die 10. FIG. 6 shows a first variant of the second embodiment, in which the channel is formed within the laminate base 11 itself. This is of course more complicated to manufacture. It does make mounting of the MEMS die somewhat simpler, however, as the laminate base 11 is present under the whole of the MEMS die 10 so that silicone glue can be uniformly applied under the whole of the MEMS die 10. The same reference numerals have been used in FIGS. 5 and 6 as in FIG. 4 to represent the same features.

FIGS. 7a and 7b show a second variant of the second embodiment. In this variant, the acoustic inlet port 14 does not have a simple circular shape. Instead, it is formed by a slit in the cap 13 that is then depressed inwardly. Thus, the opening of the acoustic inlet port is an elongate shape at one end of the acoustic inlet port 14, tapering to a point at the other end of the depression, as shown in FIG. 7b. The shape of the nozzle 15 is also elongate to correspond to the shape of the opening in acoustic inlet port 14.

In the other designs presented above, the position of the acoustic inlet port 14 in the cap 13 is quite critical. This is because space has to be left around the acoustic inlet port 14 for sealing the nozzle 15 to the cap 13. Thus, misplacement of the acoustic inlet port 14 in the cap 13 can lead to a sealing failure. This variant allows for a certain mismatch in alignment between the centre of the opening in acoustic inlet port 14 and the centre of nozzle 15 without preventing a good seal being made.

FIGS. 8a and 8b show a third variant of the second embodiment. This variant has a similar type of acoustic inlet port 14 to the second variant above. However, it has a different design of nozzle 15. As can best be seen from FIG. 8b, the nozzle 15 has a L-shape, with a base 20 and an upright portion 21. A hole 22 is formed in the base 20 to couple the chamber 18 with the channel 16. A hole 23 formed through the upright portion 21 couples the acoustic inlet port 14 to the channel 16.

In the other designs presented above, it is necessary to seal the nozzle 15 to the side wall of the MEMS die 10. This is complicated and expensive. This variant simplifies the sealing arrangements because the MEMS die can be mounted on the base 20 before either part is mounted on the laminate base 11. The complete assembly of nozzle 15 and MEMS die can then be mounted on the laminate base 11. Furthermore, this design of nozzle helps to decouple mechanical stress in the laminate base 11 caused by soldering the MEMS die 10 since silicone glue can be used to mount the MEMS die 10 to the nozzle 15 and the assembly of nozzle 15 and MEMS die 10 to the laminate base 11. Stress transfer between the laminate base 11 and the MEMS die 10 results in a temperature dependency of sensitivity. Thus, this design of nozzle 15 helps to reduce such temperature dependency.

Figure 9:
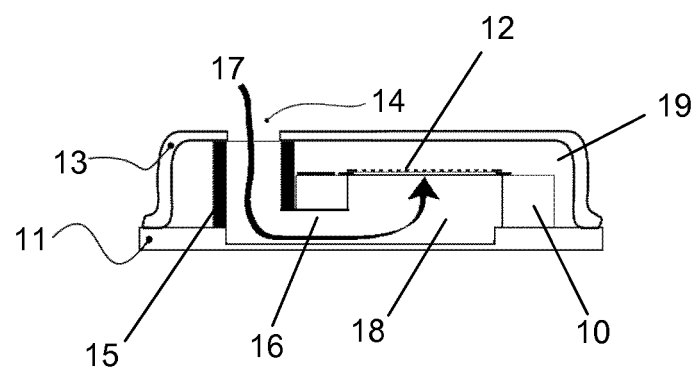
FIG. 9 shows a third embodiment of a microphone according to the invention.

FIG. 9 shows a third embodiment, which is effectively a combination of the first and second embodiments. In the third embodiment, the channel is formed in the MEMS die 10 and in the laminate base 11. The same reference numerals have been used in FIG. 9 as in FIG. 4 to represent the same features.

As explained above, the designs shown enable a large back volume to be obtained in a top-port design, by having the back volume defined between the membrane and the cap (as for a conventional bottom-port design).

In addition, the use of a nozzle within the back volume which is formed as an inserted component to define the acoustic path from the top port to the membrane enables the back volume to be kept large. In particular, the part of the nozzle which extends upwardly to define the top-port is entirely within the back volume, and is thus surrounded by the back volume space. This means the nozzle does not need to be positioned laterally beyond the extent of the back volume. Instead the back volume can extend further than the nozzle. This means that the back volume is comparable to a bottom port design—the back volume is only reduced by the volume of the nozzle. For this reason, the nozzle preferably has a small volume. This is achieved by forming the nozzle with thin walls. For example, with reference to FIG. 8b, the width of the upright portion 21 can be less than twice the diameter of the hole 23.

The nozzle volume is typically less than 20% of the total back volume, and may be less than 15%. The back volume can be increased of course by increasing the cap area to take account of the loss of volume resulting from the nozzle.

By "surrounded", it is meant that there is a space between the cap side walls and the nozzle. The nozzle does not have to be contacted on all sides by the back volume.

By keeping the volume of the nozzle to a minimum, the floor space of the overall component can be kept as small as possible.

The nozzle can also perform the function of sealing the top-port. By using a metal cap 13, the nozzle does not need to be conductive, since the EMI shielding is already sufficient. Thus, it can comprise an elastic material, such as silicone. This enables the nozzle to absorb production tolerances to form an airtight connection between the cap 13 and the MEMS die 10, as well as forming the seal around the underside of the top port.

Other elastic materials may be used, such as other rubbers or conformal plastics materials. Any material suitable for forming a compression seal can be used. In some examples, the material needs to retain its shape as it is partly suspended (FIG. 8, where the insert is supported at lateral edges). In other examples, the material can be more flexible as it is completely sandwiched between the substrate and cap such as in FIG. 4.

In other designs, the nozzle does not have to perform any sealing function. Elastic glues can be used between the nozzle and the cap, between the nozzle and the substrate, between the nozzle and the ASIC and between the nozzle and the MEMS die. Thus, the required sealing and elasticity can be provided by glues instead of by the nozzle itself.

These features mean that a single component (the insert) and its associated glues if required perform the multiple functions of defining an acoustic path from the top port to the underside of the membrane, sealing the top port, and providing a seal between the cap and substrate, so that the volumes on each side of the membrane are isolated (the inside of the nozzle is part of the inlet side of the membrane, and the outside of the nozzle is part of the back volume).

In embodiments where the insert has a design which defines an upright nozzle portion and a base portion on which the MEMS die is seated (as in FIG. 8), the nozzle material also isolates the mechanical stress in the laminate 11 due to temperature differences between the MEMS die and the package, resulting in a changed sensitivity. However, this additional function is can still be achieved with a single insert component.

Figure 1:
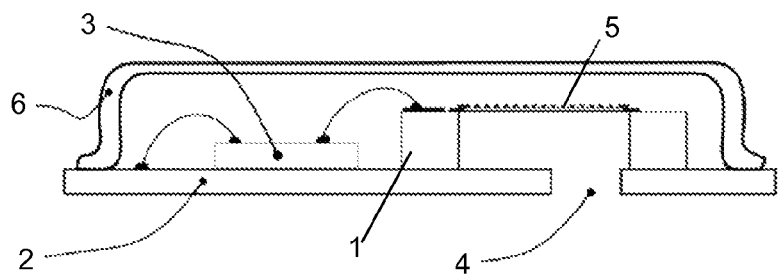
FIG. 1 shows a cross-section through an example of a prior art bottom-port microphone.
Figure 2:
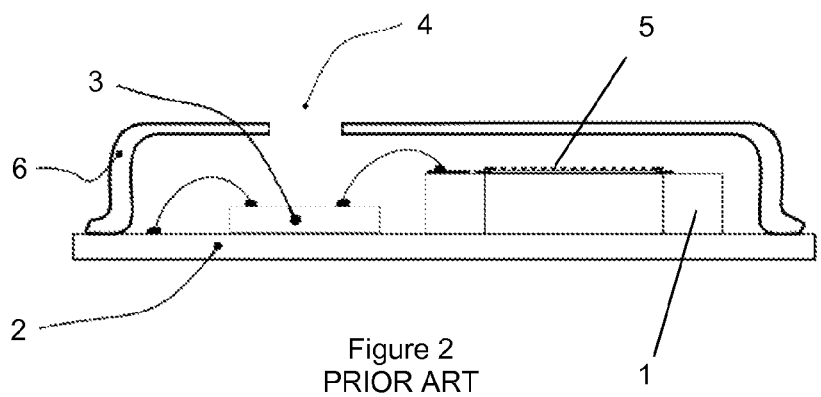
FIG. 2 shows a cross-section through an example of a prior art top-port microphone.
Figure 3:
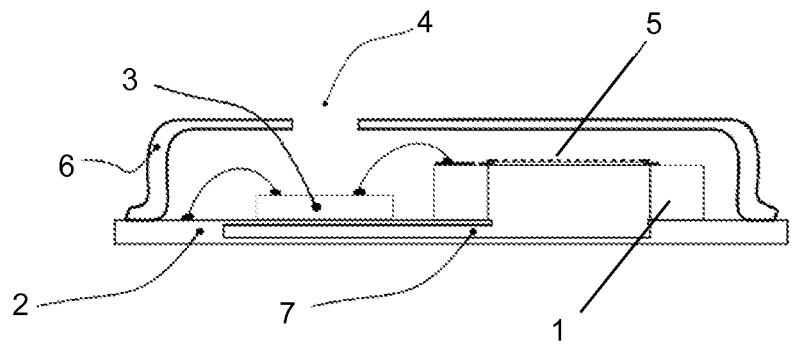
FIG. 3 shows a cross-section through an example of a second type of prior art top-port microphone.

Compared to the standard top port concept of FIG. 2, the nozzle acts as dust shield, moisture shield and light shield. These measures protect the underlying ASIC. In the standard approach of FIG. 2, the ASIC is completely unprotected.

The nozzle can also perform the function of a glob top. In particular, the nozzle glue used to bond the nozzle to the substrate or ASIC can be used to protect wire bonds to the ASIC. This protects the balls of the wire bond connections against erosion. By wire bonding prior to applying the nozzle, the nozzle can in this way be used to envelop the ball pads by the glue that flows out of the die-nozzle connection.

Compared to bottom port microphones, the nozzle protects the membrane during handling against a sharp item which is able to rupture the membrane through the sound opening.

Furthermore nozzle acts as an additional light shield.

The acoustic performance of the microphone is determined by the smallest dimension along the acoustic path 17. This is found in the channel 16, which represents a bottleneck in the acoustic path 17. The channel dimension may be less than 100 μm, although different designs can allow this to be enlarged somewhat.

Figure 10:
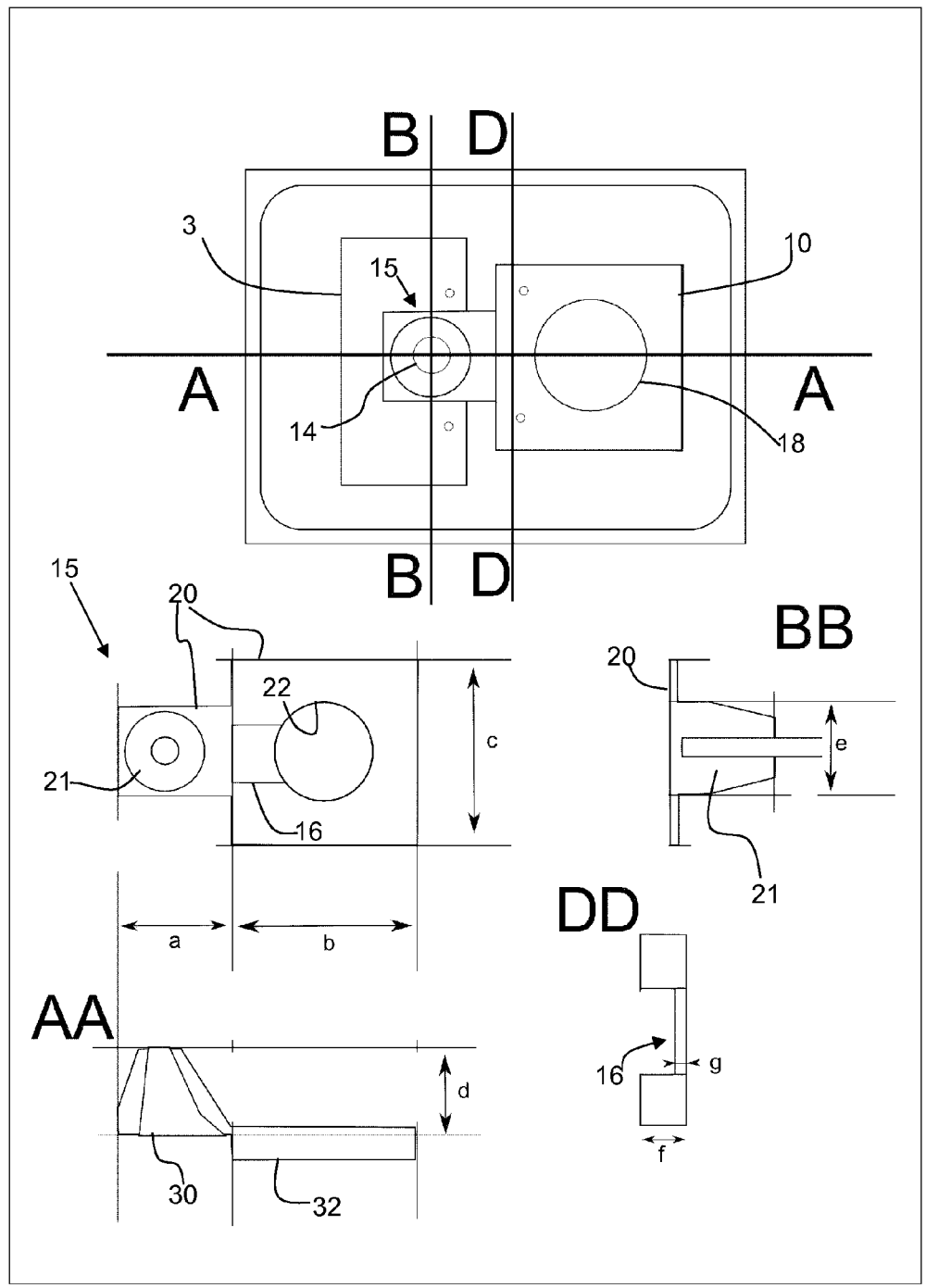
FIG. 10 shows in more detail one design of the nozzle used in the microphone of the invention.

FIG. 10 shows in more detail one design of the nozzle used in the microphone of the invention.

The main plan view shows the square MEMS die 10 with the opening 18 beneath the membrane. Next to the MEMS die 10 is the ASIC 3. The nozzle 15 is seated on the ASIC 3 and the nozzle opening is aligned with the acoustic inlet port 14 in the cover.

The plan view of the nozzle 15 alone shows that the upright part of the nozzle 21 sits on a base 20 which provides a flat top area against which the MEMS die 10 is glued. The channel 16 is at the underside of the base 20, so that the top surface of the base is a continuous surface, apart from the opening 22.

The channel 16 formed at the underside of the base 20 can be seen clearly in the cross section DD.

Cross section BB shows the upright part 21 of the nozzle, extending up from the base 20.

Cross section AA shows how the nozzle has a lower surface area 30 for seating on the ASIC, and a different lower surface area 32 for seating on the substrate. The connection between the upright nozzle part and the channel is not shown in FIG. 10—this can be seen from FIG. 11A below.

Typical dimensions for the design of FIG. 10 are a=1 mm (width of base beneath the nozzle), b=c=1.5 mm (size of MEMS die), d=0.6 mm (height of upright part of the nozzle, corresponding to height of cap), e=0.5 mm (width of upright nozzle), f-=0.25 mm (thickness of base part of nozzle beneath the MEMS die), g=0.05 mm (thickness of cover region of the nozzle over the channel 16).

Figure 11A:
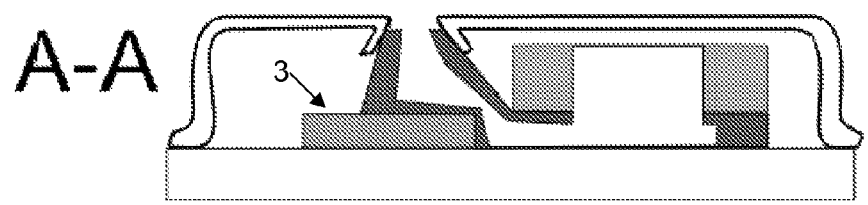
FIG. 11 shows two designs in cross section in more detail.

FIG. 11A shows the full design of FIG. 10 using the cross section AA, and shows more clearly the transition of the acoustic path between the upright nozzle part and the channel part.

Figure 11B:
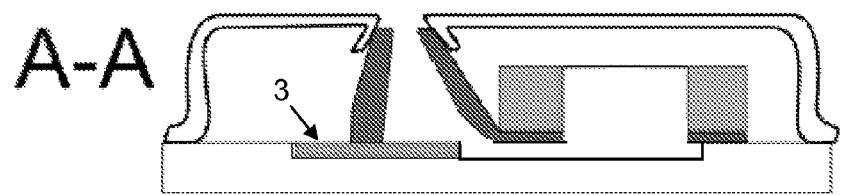

In FIG. 11B, an alternative is shown. Instead of the nozzle stepping down over the ASIC, the ASIC is mounted in a recess in the substrate, and that recess also forms the lateral channel. The nozzle is supported at its edges over the substrate. This shows the concept behind the design of FIG. 8a in more detail, and includes the ASIC not shown in FIG. 8a.

Figure 12:
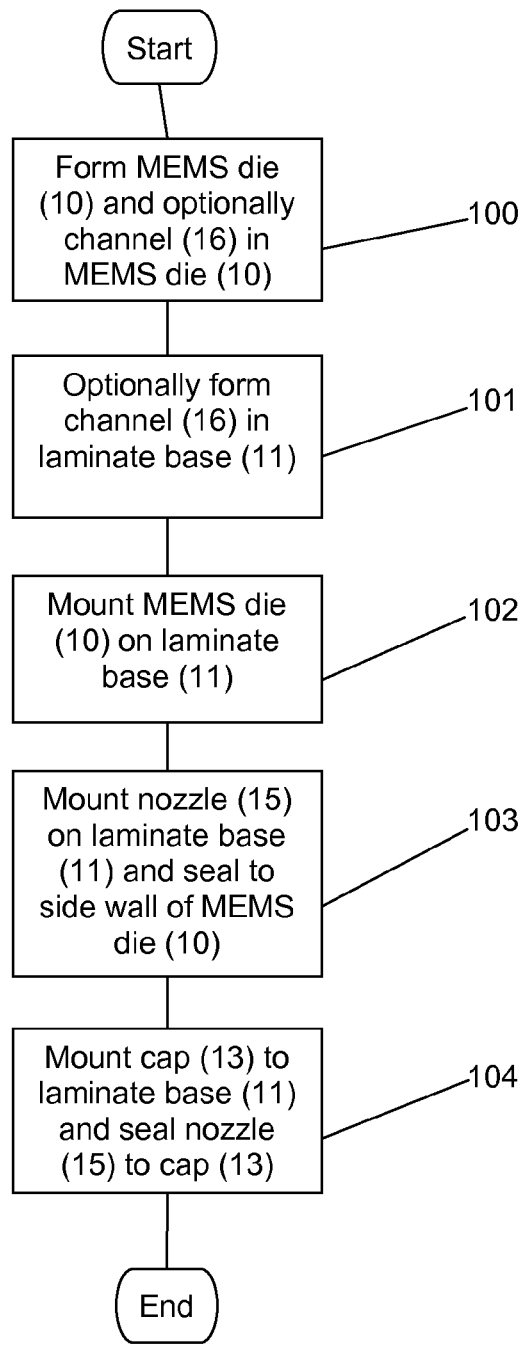
FIG. 12 shows a flow chart for a method of manufacturing a microphone according to either of the first or second embodiments of the invention.

FIG. 12 shows a flow chart of the manufacturing process for the devices of the first, second and third embodiments. In this process, the MEMS die 10 is formed in step 100. If the device is manufactured according to the second embodiment (i.e. with no channel in the MEMS die 10) then the MEMS die 10 is formed using a deep reactive ion etching (DRIE) process to anisotropically etch the MEMS die 10 in a region defining the chamber 18 underneath the membrane 12 until the membrane 12 is released from the MEMS die 10. Alternatively, if the device is manufactured according to the first or third embodiment (i.e. with a channel in the MEMS die 10) then the MEMS die 10 is formed using a first stage of the DRIE process over an area defining a combination of the chamber 18 and the channel 16. Once etching has occurred to a depth sufficient to form the channel 16 then a second stage of the DRIE process is used over an area defining the chamber 18 only until the membrane 12 is released from the MEMS die 10.

In step 101, the channel 16 is formed in the laminate base 11 in the case of the second and third embodiments only.

In step 102, the MEMS die 10 is mounted on the laminate base 11 using a silicone glue. In step 103, the nozzle 15 is then mounted on the laminate base 11 adjacent the side wall of the MEMS die 10 using a silicone glue to seal it to the laminate base 11 and to the side wall of the MEMS die 10. Lastly, the cap 13 is mounted on the laminate base 11 in step 104, the nozzle being sealed to the cap 13 using a silicone glue.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A microphone comprising:
    a housing formed by a cap sealed to a substrate;
    a MEMS die mounted on the substrate, the MEMS die incorporating a membrane, the membrane having a first surface facing the substrate and in fluid communication with an acoustic inlet port in the cap via an acoustic path, and a second surface facing the inner surface of the cap, which second surface along with part of the inner surface of the cap defines at least part of a sealed chamber within which a volume of air is trapped; and
    an insert comprising an upright nozzle, the insert provided within the sealed chamber and the upright nozzle being surrounded by the sealed chamber volume;
    wherein the acoustic path is defined at least in part by the upright nozzle terminating at the acoustic inlet port at a first end and at a channel at the second end, the channel leading to a second chamber beneath the first surface of the membrane.

2. The microphone of claim 1, wherein the channel is formed in the substrate and/or a side wall of the MEMS die and couples the second end of the upright nozzle to the second chamber.

3. The microphone of claim 1, wherein the acoustic inlet port is formed by a single hole or by an array of holes.

4. The microphone of claim 1, wherein the acoustic inlet port is formed by making a slit in the cap and depressing the cap in a region adjacent the slit.

5. The microphone of claim 1, wherein the upright nozzle is sealed to the cap around the acoustic inlet port.

6. The microphone of claim 1, wherein the upright nozzle is provided against and sealed to a side wall of the MEMS die.

7. The microphone of claim 1, wherein the insert further comprises a base portion and an upright portion which defines the upright nozzle, the base portion and upright portion disposed orthogonally, the base portion having a first hole for coupling the second chamber to the channel and the upright portion having a second hole for coupling the acoustic inlet port to the channel.

8. The microphone of claim 1, wherein the insert comprises an elastic material, and the upright nozzle defines a seal between the cap and the substrate.

9. The microphone of claim 8, wherein the elastic material comprises silicone.

10. A method of manufacturing a microphone, the method comprising:

mounting a MEMS die on a substrate;

providing an insert over the substrate, the insert comprising an upright nozzle; and sealing the substrate to a cap, with an opening in the cap aligned with the upright nozzle, wherein the MEMS die incorporates a membrane and is mounted on the substrate such that first and second surfaces of the membrane face the substrate and an inner surface of the cap respectively, wherein sealing the substrate to the cap comprises:

forming a sealed chamber within which a volume of air is trapped, the sealed chamber being defined by the second surface of the membrane along with part of the inner surface of the cap, with the upright nozzle surrounded by the sealed chamber volume;

forming an acoustic path by which the first surface of the membrane is placed in fluid communication with an acoustic inlet port in the cap by means of the upright nozzle.

11. The method of manufacturing a microphone according to claim 10, further comprising forming a channel in the substrate and/or a side wall of the MEMS die, the channel coupling a second chamber, at least part of which is defined by the first surface of the membrane, with the remainder of the acoustic path.

12. The method of manufacturing a microphone according to claim 10, further comprising sealing the upright nozzle to the side wall of the MEMS die.

13. The method of manufacturing a microphone according to claim 10, wherein the upright nozzle is sealed to the cap around the acoustic inlet port using a silicone glue, and defines a seal between the cap and the substrate.

14. The method of manufacturing a microphone according to claim 10, wherein the MEMS die is mounted on the substrate using a silicone glue.

15. The method of manufacturing a microphone according to claim 10, wherein the MEMS die is manufactured using a first anisotropic etching process, such as DRIE, to etch a region of the MEMS die defining a combination of a second chamber, at least part of which is defined by the first surface of the membrane, and the channel followed by a second anisotropic etching process, such as DRIE, to etch a region of the MEMS die defining the second chamber alone until the membrane is released.

* * * * *